US006203218B1

(12) United States Patent
Omori et al.

(10) Patent No.: US 6,203,218 B1
(45) Date of Patent: Mar. 20, 2001

(54) SUBSTRATE PROCESSING APPARATUS AND SUBSTRATE PROCESSING METHOD

(75) Inventors: Tsutae Omori, Yamanashi-Ken; Mitsuhiro Sakai; Shinobu Tanaka, both of Kumamoto-Ken, all of (JP)

(73) Assignee: Tokyo Electron Ltd. (JP)

( * ) Notice: Subject to any disclaimer, the term of this patent is extended or adjusted under 35 U.S.C. 154(b) by 0 days.

(21) Appl. No.: 09/362,963

(22) Filed: Jul. 30, 1999

(30) Foreign Application Priority Data

Jul. 31, 1998 (JP) .................................................. 10-229527

(51) Int. Cl.⁷ ...................................................... G03D 5/00
(52) U.S. Cl. ........................... 396/611; 396/627; 156/584; 118/52
(58) Field of Search .................................... 396/604, 611, 396/627; 118/52, 319, 500, 316; 156/584; 427/240; 134/902, 153, 32, 33, 72

(56) References Cited

U.S. PATENT DOCUMENTS

| | | | |
|---|---|---|---|
| 4,688,918 | * 8/1987 | Suzuki et al. | 396/611 |
| 5,688,411 | * 11/1997 | Kutsuzawa et al. | 134/32 |
| 5,718,763 | 2/1998 | Tateyama et al. | 118/52 |
| 5,779,796 | * 7/1998 | Tomoeda et al. | 118/319 |
| 5,871,584 | * 2/1999 | Tateyama et al. | 118/52 |
| 5,984,540 | * 11/1999 | Mimasaka et al. | 396/611 |
| 6,012,858 | * 1/2000 | Konishi et al. | 396/611 |
| 6,062,288 | * 5/2000 | Tateyama | 156/584 |

FOREIGN PATENT DOCUMENTS 9-260278 * 10/1997 (JP) .

* cited by examiner

*Primary Examiner*—D. Rutledge
(74) *Attorney, Agent, or Firm*—Rader, Fishman & Grauer (57) ABSTRACT

When an edge processing head is scanned in one direction, the discharge of a rinse solution from a rinse solution discharge nozzle at the front in a carrying direction is stopped, a developing solution is discharged from a developing solution discharge nozzle, and a rinse solution is discharged from a rinse solution discharge nozzle at the rear in the carrying direction. Specifically, with a developing solution being discharged to a glass substrate, the discharge of a rinse solution immediately follows the discharge of the developing solution. Thus, the edge processing of the substrate can be performed with minimal increases in the number of processes and in installation.

20 Claims, 9 Drawing Sheets

SUBSTRATE PROCESSING APPARATUS AND SUBSTRATE PROCESSING METHOD

FIELD OF THE INVENTION

The present invention relates to a substrate processing apparatus and a substrate processing method for processing the edge portion of a substrate for a color filter in a liquid crystal color display, for example, after a resist is applied thereto.

BACKGROUND OF THE INVENTION

A color filter in a liquid crystal color display requires the formation of a colored pattern of R, G, and B on a glass substrate. Such a colored pattern is formed, for example, by a photolithography method. As an example thereof, a pre-colored resin made from a photosensitive resin is used for each of R, G, and B, and the process of coating-exposure-developing is repeated three times for R, G, and B to form a pattern.

Incidentally, in the above developing process, negative type development processing in which an unexposed portion of the photosensitive resin is removed with a developing solution to thereby form a pattern is performed. Generally in a process after resist-coating, edge processing for removing a resist remaining at the edge portion of the glass substrate is needed. Hence, in the negative type processing, the aforesaid edge processing is performed with a developing solution.

Meanwhile, in positive type edge processing, edge processing in which a resist remaining at the edge portion of the glass substrate is removed with an organic solvent such as a thinner is performed.

SUMMARY OF THE INVENTION

However, in the case where a developing solution is used in edge processing as described above, there is a disadvantage that rinse processing with a rinse solution such as demineralized water or the like is needed after the developing solution is used, which causes an increase in the number of processes and an increase in installation.

The present invention is made to eliminate the above disadvantage and the object thereof is to provide a substrate processing apparatus and a substrate processing method in which the edge processing of a substrate can be performed with minimal increases in the number of processes and in installation.

In order to eliminate the above disadvantage, as one of the main aspects of the present invention, a substrate processing apparatus includes a holding member for holding a substrate, a first nozzle having a plurality of discharge ports each for discharging a developing solution to an edge portion of the substrate held by the holding member, a second nozzle disposed adjacent to the first nozzle and having a discharge port for discharging a rinse solution to the edge portion of the substrate held by the holding member, and carrying means for carrying the second nozzle and the first nozzle in the direction of one side of the substrate held by the holding member.

Accordingly, such a structure that a developing solution is discharged from the first nozzle and a rinse solution is discharged from the second nozzle disposed at the rear in a carrying direction is provided, whereby the removal of the remnants at the edge portion of the substrate with a developing solution and the removal of the developing solution with a rinse solution can be performed at the same time.

Moreover, the first and the second nozzles are provided in one head, thereby simplifying the configuration and facilitating the control thereof. As a result, the edge processing of a substrate can be performed with minimal increases in the number of processes and in installation.

These objects and still other objects and advantages of the present invention will become apparent upon reading the following specification when taken in conjunction with the accompanying drawings.

DETAILED DESCRIPTION OF THE INVENTION

Figure 1:
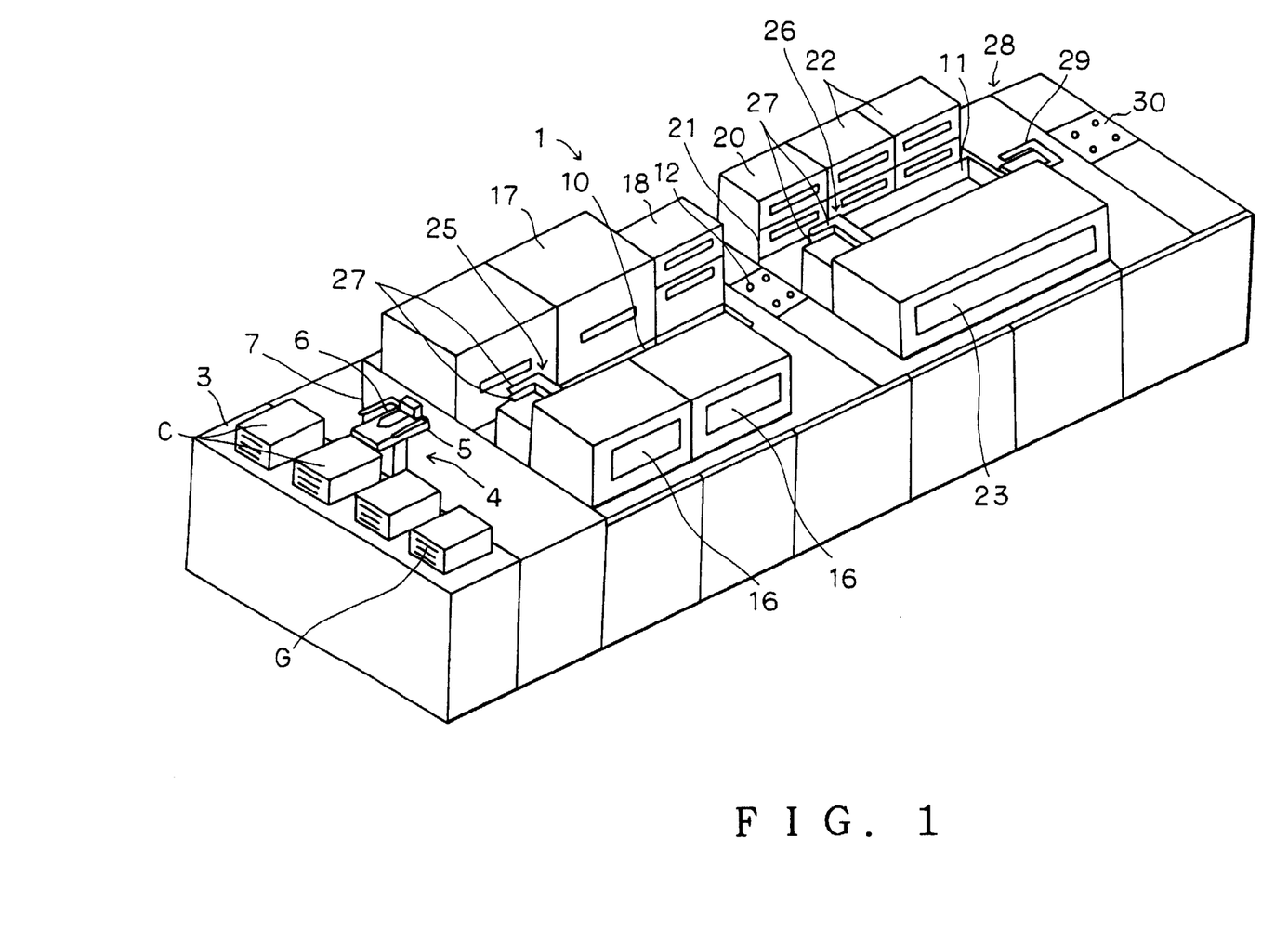
FIG. 1 is a perspective view of a coating and developing system according to an embodiment of the present invention.

FIG. 1 is a perspective view of a coating and developing system according to an embodiment of the present invention.

As shown in FIG. 1, provided in the front portion of the coating and developing system 1 is a loader and unloader section 2 for carrying a substrate, for example, a rectangular glass substrate G for a color filter into or out of the coating and developing system 1. In the loader and unloader section 2, a cassette mounting table 3 where cassettes C each housing, for example, 25 glass substrates G are mounted at predetermined positions in line and a loader and unloader 4 for taking the glass substrate G to be processed out of each of the cassettes C and returning the glass substrate G which has completed processing in the coating and developing system 1 to each of the cassettes C are provided. The loader and unloader 4 shown moves in a direction of arrangement of the cassettes C by traveling a main body 5, takes the glass substrate G out of each cassette C with tweezers 6 in the form of sheets provided on the main body 5, and returns it to each cassette C. On both sides of the tweezers 6 is provided a substrate aligning member 7 for aligning the glass substrate G while holding the four corners thereof.

In the central portion of the coating and developing system 1, corridor-shaped transfer paths 10 and 11 disposed in a longitudinal direction are provided in a straight line via a first delivery section 12. On both sides of the transfer paths 10 and 11, various processing apparatus for performing processing of various kinds for the glass substrate G are provided.

In the coating and developing system 1 shown, cleaning apparatus 16 for cleaning the glass substrate G with a brush and cleaning it by high pressure jet water are arranged side by side on one side of the transfer path 10. On the opposite side across the transfer path 10, a developing apparatus 17 is provided, next to which two heating apparatus 18 are piled one upon the other.

On one side of the transfer path 11, cooling apparatus 20 for cooling are two-tiered. Adjacent to the cooling apparatus 20, two sets of two-tiered heating apparatus 22 are arranged next to each other. On the opposite side across the transfer path 11 is arranged a coating apparatus 23 for forming a precolored resin film made from a photosensitive resin on a front surface of the glass substrate G by applying a precolored resin made from the photosensitive resin to the glass substrate G. Although not shown, an aligner for exposing a predetermined fine pattern for the precolored resin film, which is made from the photosensitive resin, formed on the glass substrate G, and the like are provided on a side portion of the coating apparatus 23 across a second delivery section 28. The second delivery section 28 includes transfer tweezers 29 for carrying the glass substrate G in and out and a delivery table 30.

The aforesaid processing apparatus 16 to 18, and 20, 22, and 23 are provided on both sides of the transfer paths 10 and 11 with respective transfer ports for the glass substrate G facing inward. A first transfer device 25 moves on the transfer path 10 in order to transfer the glass substrate G between the loader and unloader section 2, the processing apparatus 16 to 18, and the first delivery section 12. A second transfer device 26 moves on the transfer path 11 in order to transfer the glass substrate G between the first delivery section 12, the second delivery section 28, and the processing apparatus 20, 22, and 23. Each of the transfer devices 25 and 26 has a pair of upper and lower arms 27 and 27. When the transfer devices make access to the processing apparatus 16 to 18, and 20, 22, and 23, the processed glass substrate G is carried out of a chamber of each processing apparatus with one arm 27 and the substrate G to be processed is carried into the chamber with the other arm 27.

Figure 2:
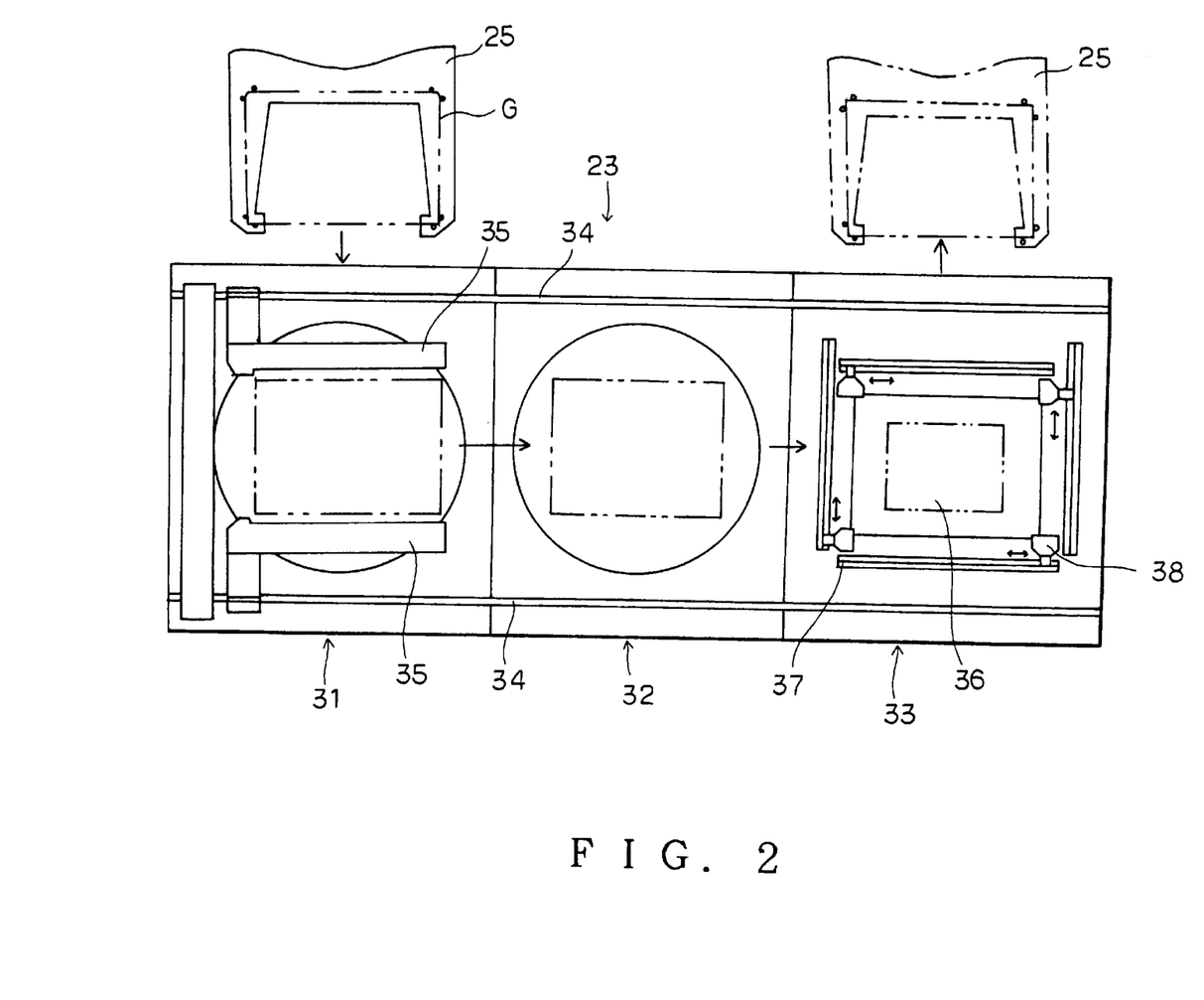
FIG. 2 is a plane view of a coating apparatus shown in FIG. 1.

FIG. 2 is a plane view of the above coating apparatus 23.

As shown in FIG. 2, in the coating apparatus 23, a coating section 31 for coating the glass substrate G with a resist, a reduced pressure drying section 32 for drying the resist-coated glass substrate G under reduced pressure, and an edge processing section 33 as an edge processing apparatus of the present invention for processing the edge portion of the glass substrate G are arranged adjacent to one another.

Transfer rails 34 are provided in front of and behind the coating apparatus 23, and transfer arms 35 move along the transfer rails 34 respectively.

The glass substrate G brought into the coating section 31 by the transfer device 25 is transferred in sequence to the coating section 31, the reduced pressure drying section 32, and the edge processing section 33 by means of the transfer arms 35, and taken out of the edge processing section 33 by the transfer device 25.

In the edge processing section 33, scanning means, for example, transfer rails 37 each for carrying an edge processing head 38 along each of four edges, for example, the outer perimeter of each of four sides of the substrate G held by a holding member 36 in the direction of one side of the substrate G held by the holding member are provided, and each of the edge processing heads 38 is held to be able to scan along each of the transfer rails 37. Each edge processing head 38 is carried along the transfer rail 37 by drive of a drive motor not shown.

Figure 3:
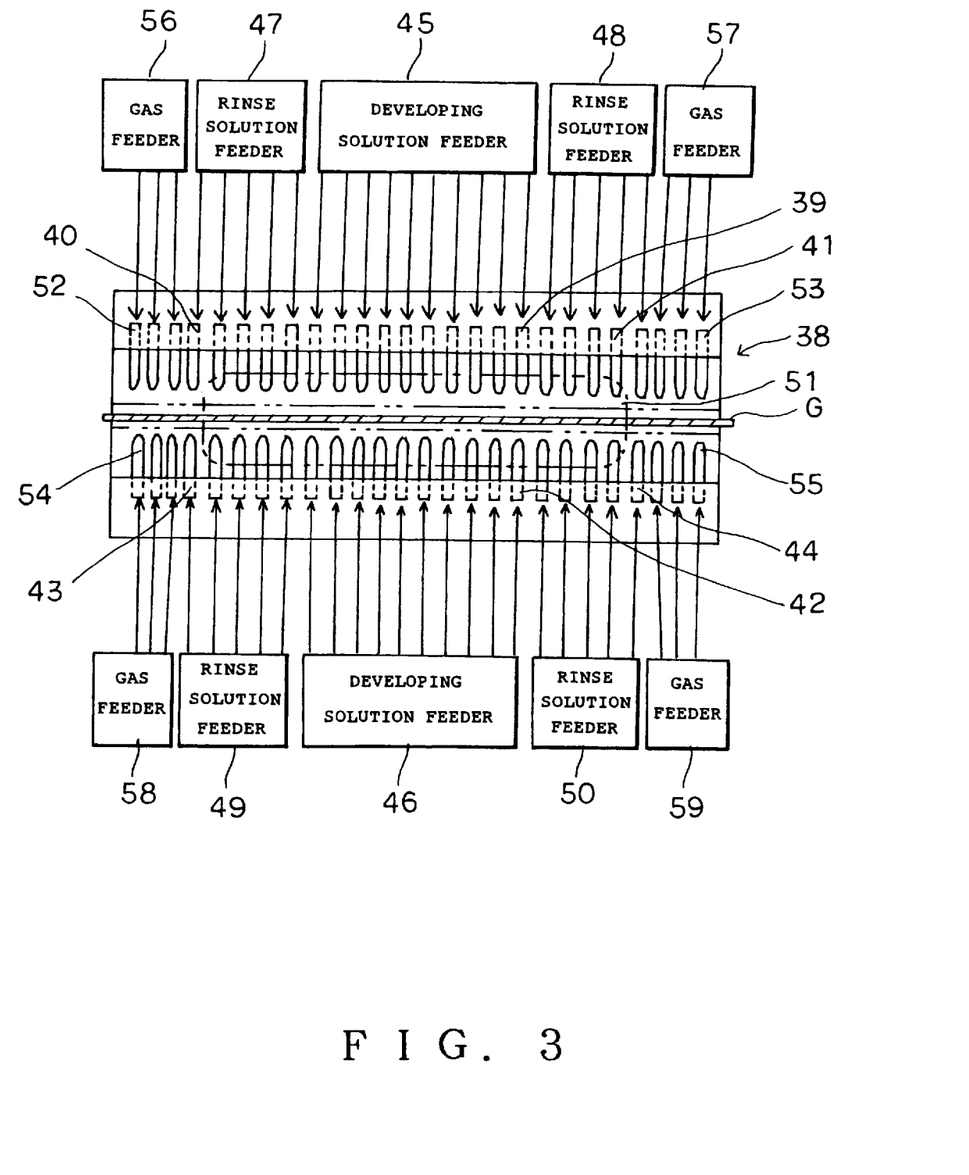
FIG. 3 is a front view of an edge processing head shown in FIG. 2.
Figure 4:
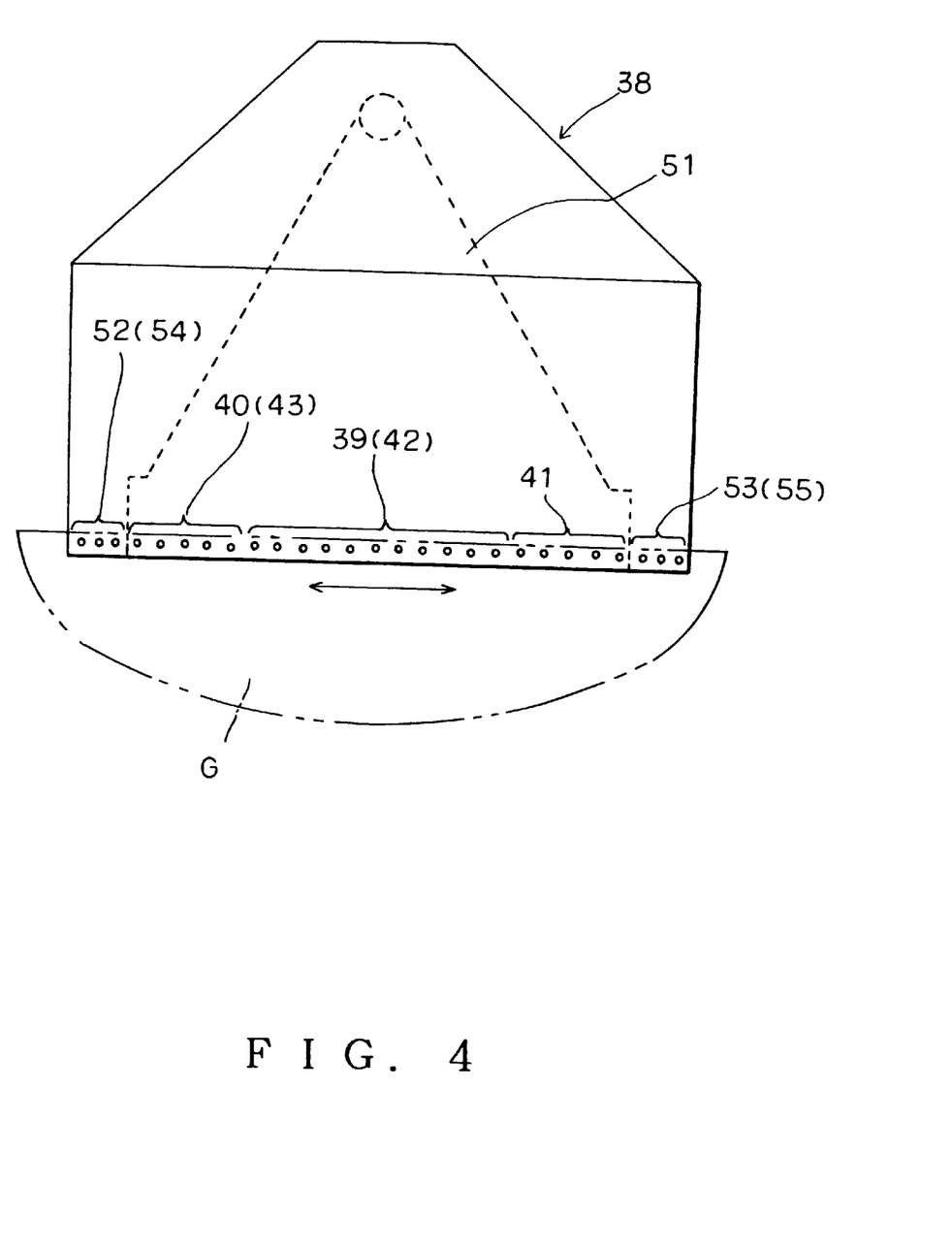
FIG. 4 is a plane view of the edge processing head shown in FIG. 2.
Figure 5A:
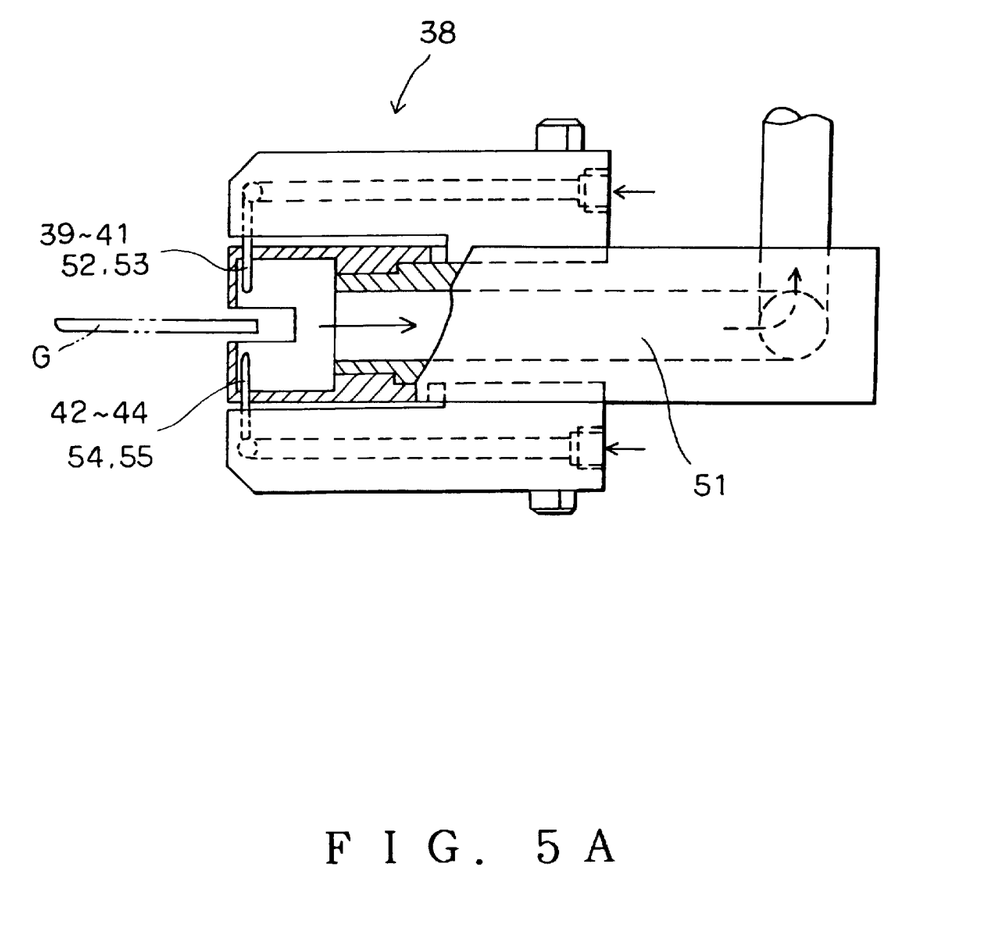
FIG. 5A is a side elevational view of the edge processing head shown in FIG. 2.

FIG. 3 is a front view of the above edge processing head 38, FIG. 4 is a plane view thereof, and FIG. 5A is a side elevational view thereof.

As shown in the above views, in the nearly central portion of the edge processing head 38, ten of first nozzles, for example, developing solution discharge nozzles 39 each including a plurality of discharge ports each for discharging a developing solution onto the edge portion of the front surface of the glass substrate G held by the holding member 36 are provided, extending over, for instance, 50 mm, in the direction of one side of the glass substrate G.

Further, on both sides of the edge processing head 38, a pair of second nozzles, for example, rinse solution discharge nozzles 40 and 41 with the developing solution discharge nozzles 39 between are arranged adjacent to the developing solution discharge nozzles 39, each including a discharge port for discharging a rinse solution onto the edge portion of the front surface of the glass substrate G held by the holding member 36. For example, five pairs of rinse solution discharge nozzles are provided, respectively extending, for instance, 25 mm, in the direction of a side of the glass substrate G.

Furthermore, on both sides of the edge processing head 38, third nozzles, for example, gas discharge nozzles 52 and 53 with the rinse solution discharge nozzles 40 and 41 between are arranged adjacent to the rinse solution discharge nozzles 40 and 41, each including a plurality of discharge ports each for discharging predetermined inert gas, for example, N2 gas onto the edge portion of the front surface of the glass substrate G held by the holding member 36. For example, a plurality of, for instance, three pairs of gas discharge nozzles 52 and 53 are provided, respectively extending over, for instance, 15 mm, in the direction of a side of the glass substrate G.

Similarly, in the nearly middle portion of the edge processing head 38, a plurality of, for example, ten developing solution discharge nozzles 42 for discharging a developing solution onto the edge portion of the rear surface of the glass substrate G held by the holding member 36 are provided, extending over, for instance, 50 mm, in the direction of a side of the glass substrate G.

Further, on both sides of the edge processing head 38, a plurality of, for example, five pairs of rinse solution discharge nozzles 43 and 44 each for discharging a rinse solution onto the edge portion of the rear surface of the glass substrate G held by the holding member 36 are arranged with the developing solution discharge nozzles 42 between, respectively extending, for instance, 25 mm, in the direction of a side of the glass substrate G.

Furthermore, on both sides of the edge processing head 38, a plurality of, for instance, three pairs of gas discharge nozzles 54 and 55 as third nozzles with the rinse solution discharge nozzles 43 and 44 between arranged adjacent to the rinse solution discharge nozzles 43 and 44, each including a plurality of discharge ports for discharging predetermined gas, for example, N2 gas of inert gas onto the edge portion of the rear surface of the glass substrate G held by the holding member 36, are provided, respectively extending over, for instance, 15 mm, in the direction of a side of the glass substrate G. The developing solution discharged nozzles 39 and 42, the rinse solution discharge nozzles 40, 41, 43, and 44, and the gas discharge nozzles 52 to 55 are provided for both the front and rear surfaces of the substrate G, whereby a developing solution, a rinse solution, and N2 gas can be discharged onto both the front and rear surfaces of the substrate G independently of one another.

Figure 5B:
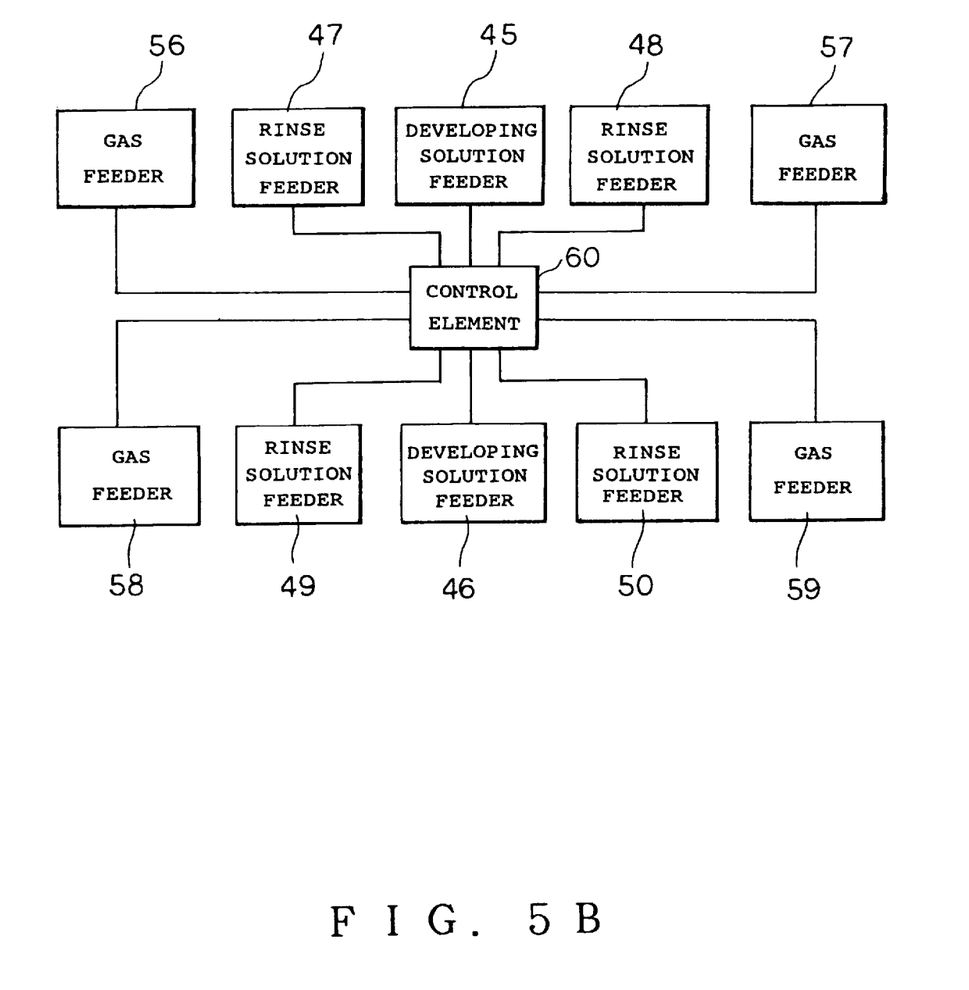
FIG. 5B is an explanatory view of a control element of the edge processing head shown in FIG. 2.

Developing solutions are supplied from developing solution feeders 45 and 46 to the developing solution discharge nozzles 39 and 42 respectively, rinse solutions are supplied from rinse solution feeders 47 to 50 to the rinse solution discharge nozzles 40, 41, 43, and 44 respectively, and N2 gas is supplied from gas feeders 56 to 59 to the gas discharge nozzles 52 to 55 respectively. As shown in FIG. 5B, the supply from the developing solution feeders 45 and 46, the rinse solution feeders 47 to 50, and the gas feeders 56 to 59 is controlled by a control element 60.

Accordingly, it is possible to provide such control that N2 gas is discharged from each of the gas discharge nozzles 52 to 55 while a rinse solution is discharged from each of the rinse solution discharge nozzles 40, 41, 43, and 44.

Further, it is possible to provide such control that a rinse solution is discharged from each of the rinse solution discharge nozzles 40, 41, 43, and 44 while a developing solution is discharged from each of the developing solution discharge nozzles 39 and 42. Furthermore, it is possible to provide control so that at least one period of time out of the times for: discharging a developing solution from each of the developing solution discharge nozzles 39 and 42; discharging a rinse solution from each of the rinse solution discharge nozzles 40, 41, 43, and 44; and discharging N2 gas from each of the gas discharge nozzles 52 to 55, is different from the other two.

In this embodiment, as a developing solution, a developing solution with a high concentration, for example, of approximately 10% is used. Thus, the remnant at the edge portion of the substrate in negative type resist processing can be removed with a clean cut end. As a rinse solution, for example, demineralized water (D. I. W.) is used.

On the rear sides (the sides facing the edge portion of the substrate) of the aforesaid nozzles 39 to 44, suction means, for instance, a suction port 51 for sucking a developing solution and a rinse solution discharged from each of the nozzles 39 to 44 in the outer peripheral direction of the substrate is provided. The suction port 51 is structured to narrow toward the rear side. An exhauster not shown is connected to the suction port 51. For example, a suction mechanism is composed of the suction port 51 and the exhauster. The suction mechanism eliminates the splash of a developing solution and a rinse solution to the substrate side.

Next, operation will be explained.

Figure 6:
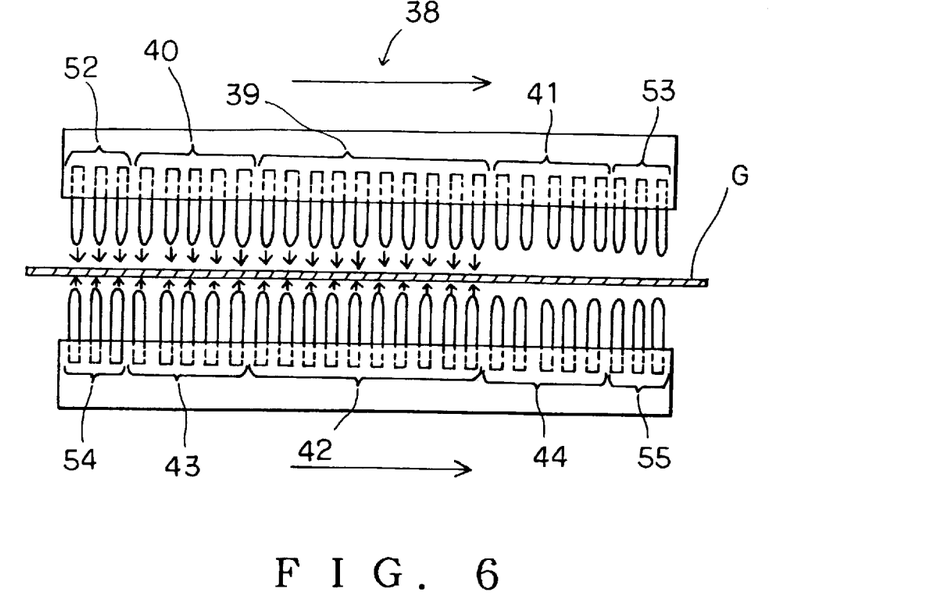
FIG. 6 is a view showing the operation of edge processing in the embodiment.

As shown in FIG. 6, when the edge processing head 38 is carried (scanned) in the right direction in FIG. 6, the discharge of a rinse solution from each of the rinse solution supply nozzles 41 and 44 at the front in a carrying (scanning) direction on the right side of FIG. 6 is stopped. A developing solution is discharged from each of the developing solution discharge nozzles 39 and 42 (a step of discharging a developing solution from each of a plurality of discharge ports to the edge portion of the held substrate), and a rinse solution is discharged from each of the rinse solution discharge nozzles 40 and 43 (a step of discharging a rinse solution from each of a plurality of discharge ports to the edge portion of the held substrate), and N2 gas is discharged from each of the gas discharge nozzles 52 and 54 (a step of discharging predetermined gas from each of a plurality of discharge ports to the edge portion of the held substrate), the rinse solution discharge nozzles 40 and 43, and the gas discharge nozzles 52 and 54 being at the rear in the scanning direction on the left side of FIG. 6.

Figure 7:
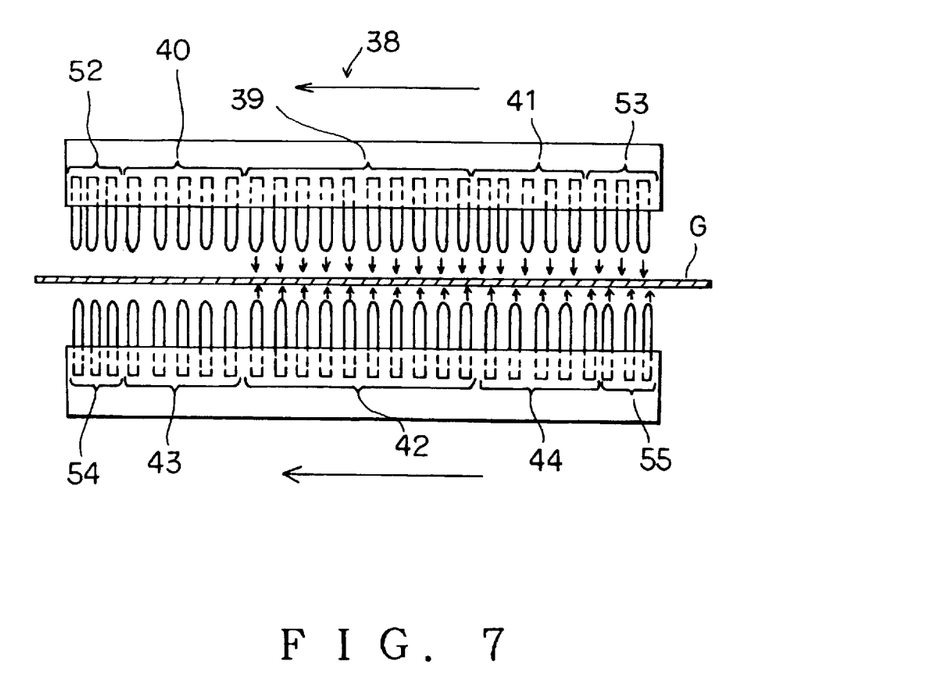
FIG. 7 is a view showing the operation of the edge processing in the embodiment.

Meanwhile, as shown in FIG. 7, when the edge processing head 38 is carried in the left direction in FIG. 7, the discharge of a rinse solution from each of the rinse solution discharge nozzles 40 and 43 at the front in a carrying direction on the left side of FIG. 7 is stopped. A developing solution is discharged from each of the developing solution discharge nozzles 39 and 42, and a rinse solution is discharged from each of the rinse solution discharge nozzles 41 and 44, and N2 gas is discharged from each of the gas discharge nozzles 53 and 55, the rinse solution discharge nozzles 41 and 44, and the gas discharge nozzles 53 and 55 being at the rear in the scanning direction on the right side of FIG. 7.

Thereafter, it is possible to repeat the operation shown in FIG. 6 and the operation shown in FIG. 7 as required.

Specifically, as soon as discharging a developing solution onto the glass substrate G, the edge processing head 38 according to the present invention discharges a rinse solution and N2 gas, following the discharge of the developing solution. Operating times for a step of discharging a developing solution and a step of discharging a rinse solution are at least partially simultaneous, whereby the removal of the remnant at the edge portion of the glass substrate G with a developing solution and the removal of the developing solution with a rinse solution can be performed at the same time, and moreover the edge portion of the substrate G can be dried by N2 gas. In addition, the nozzles 39 and 42 each for discharging a developing solution and the nozzles 40, 41, 43, and 44 each for discharging a rinse solution, and the nozzles 52 to 55 each for discharging N2 gas are integrally provided in the edge processing head 38, thus simplifying the configuration thereof and facilitating scanning control.

Incidentally, the present invention is not limited to the aforesaid embodiment.

Figure 8:
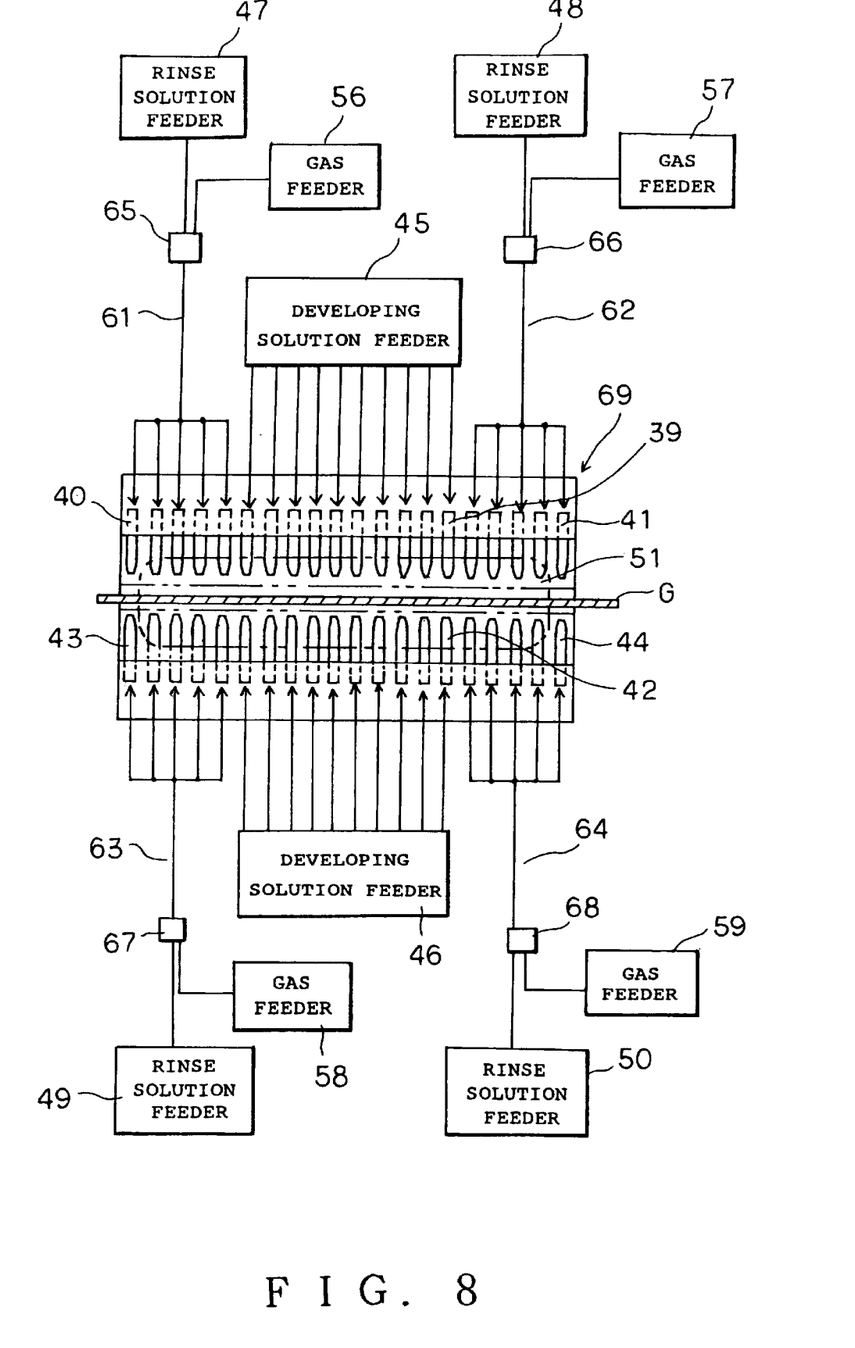
FIG. 8 is a front view showing another embodiment of an edge processing head.

With an edge processing head 69 shown in FIG. 8, an inert gas, for example, N2 gas in addition to a rinse solution may be selectively discharged from the nozzles 40, 41, 43, and 44 each for discharging a rinse solution, instead of providing gas discharge nozzles. Namely, it is possible to blow N2 gas to the edge portion of the glass substrate G via the nozzles 40, 41, 43, and 44.

Portions different from the aforesaid embodiment will be explained. As means for blowing an inert gas to the edge portion of the substrate G via each of the rinse solution discharge nozzles 40, 41, 43, and 44, air-operated three-way valves 65 to 68 are provided, for example, in pipelines 61 to 64 between the rinse solution feeders 47 to 50 and the rinse solution discharge nozzles 40, 41, 43, and 44, and the gas feeders 56 to 59 are connected to the air-operated three-way valves 65 to 68 respectively.

Figure 9:
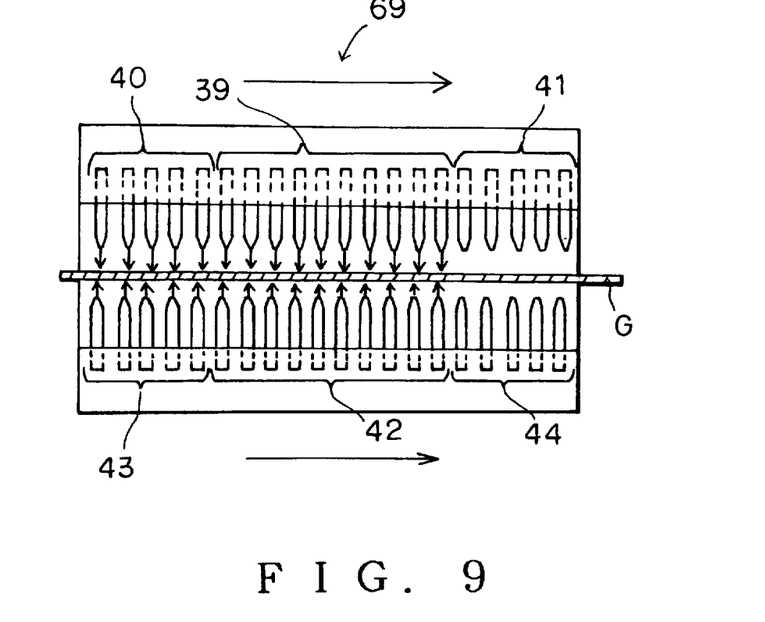
FIG. 9 is a view showing another embodiment of the operation of edge processing.

The air-operated three-way valves 65 to 68 are selectively switchable by the control element 60, and can select a rinse solution or N2 gas and discharge the rinse solution or N2 gas to the edge portion of the substrate G via each of the rinse solution discharge nozzles 40, 41, 43, and 44. Next, operation will be explained. As shown in FIG. 9, when the edge processing head 69 is carried in the right direction in FIG. 9, the discharge of a rinse solutions from each of the rinse solution discharge nozzles 41 and 44 at the front in a carrying direction on the right side of FIG. 9 is stopped. A developing solution is discharged from each of the developing solution discharge nozzles 39 and 42, and a rinse solution is discharged from each of the rinse solution discharge nozzles 40 and 43 at the rear in the carrying direction on the left side of FIG. 9.

Figure 10:
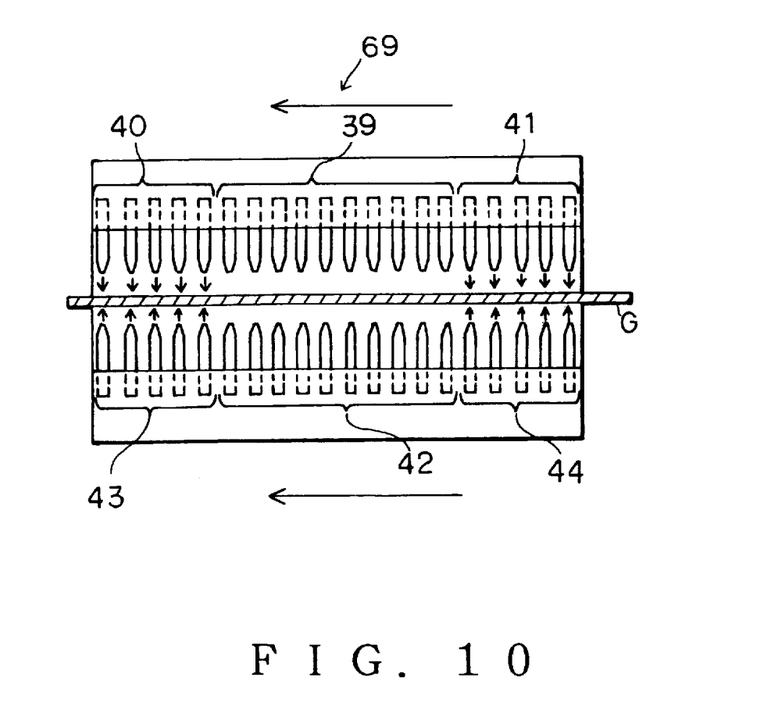
FIG. 10 is view showing another embodiment of the operation of the edge processing.

When the edge processing head 69 reaches the edge portion of the substrate G, the discharge of a developing solution and a rinse solution is stopped, and the air-operated three-way valves 65 to 68 are switched so that N2 gas can be discharged from each of the rinse solution discharge nozzles 40, 41, 43, and 44. Then, while the edge processing head 69 is carried in the left-hand direction in FIG. 10 as shown in FIG. 10, N2 gas is discharged from each of the rinse solution discharge nozzles 40, 41, 43, and 44.

By blowing N2 gas after a rinsing step as described above, drying processing can be performed, immediately following the edge processing. In addition, the gas discharge nozzles 52 to 55 can be omitted, thus enabling the edge processing head 69 to decrease in size and further enabling the apparatus to decrease in size.

Although a developing solution is discharged from each of the developing solution discharge nozzles 39 and 42 and a rinse solution is discharged from each of the rinse solution discharge nozzles at the rear in a scanning direction, it goes without saying that the step of discharging a developing solution may be performed at the same time as scanning in one direction of one side of the substrate G and that the step of discharging a rinse solution may be performed at the same time as scanning in the reverse direction to the one direction of the one side of the substrate G.

Specifically, when the edge processing head 38 is carried in one direction of one side of the substrate G, only a developing solution is discharged, and when the edge processing head 38 reaches the edge portion of the substrate G, the discharge of a developing solution is stopped. Thereafter, while a rinse solution is discharged from each of the rinse solution discharge nozzles 40, 41, 43, and 44 and N2 gas is discharged from each of the gas discharge nozzles 52 to 55, edge processing is performed with the edge processing head being carried in the reverse direction to the one direction of the one side of the substrate G. In this case, the state in which a developing solution is heaped at the edge portion of the substrate is maintained for a predetermined period of time, which enables a period of time in which a developing solution reacts with a resist solution to lengthen. As a result, a resist solution becomes easy to dissolve, and edge processing capacity is improved.

In the above case, even if a rinse solution is discharged from each of the rinse solution discharge nozzles 40 and 43 and N2 gas is discharged from each of the gas discharge nozzles 52 and 54 instead of using the rinse solution discharge nozzles 41 and 44 and the gas discharge nozzles 53 and 55, the edge processing is possible, thus permitting the rinse solution discharge nozzles 41 and 44 and the gas discharge nozzles 53 and 55 to be omitted, and enabling the edge processing head 38 to decrease in size and further enabling the apparatus to decrease in size.

Although the step of discharging a developing solution, the step of discharging a rinse solution, and the step of discharging predetermined gas are performed at the same time, it is possible that at least two steps are performed at the same time instead of performing the above three steps simultaneously, and moreover it is needless to say that the above three steps may be performed at different times.

When the step of discharging a developing solution and the step of discharging a rinse solution are performed simultaneously, a developing solution and a rinse solution are no longer splashed to the inside of the edge portion to be processed of the substrate G by N2 gas, thereby making accurate edge processing with desired width possible.

When the step of discharging a developing solution and the step of discharging predetermined gas are performed concurrently, a coated developing solution can be stirred by controlling the flow rate of N2 gas to be discharged, thus enabling the dissolving speed of the resist to increase and improving edge processing capacity.

When the step of discharging a rinse solution and the step of discharging predetermined gas are performed concurrently, as described above, the developing solution is supplied and the state in which the developing solution is heaped at the edge portion of the substrate is maintained for a predetermined period of time, thus allowing a period of time during which a developing solution reacts with a resist solution to lengthen, and further improving edge processing capacity.

When the three steps are performed at different times, first a developing solution is heaped and left as it is for a predetermined period of time during which the resist is dissolved, and thereafter a rinse solution is discharged to rinse out the developing solution while scanning in the reverse direction is performed, thereby improving edge processing capacity.

Subsequently, N2 gas is discharged with the rinse solution being dried to a certain extent while the edge processing head is scanned toward a position where the developing solution is heaped, whereby the rinse solution is no longer splashed to the inside of the edge portion to be processed of the substrate G.

Further, the step of discharging a developing solution and the step of discharging gas may be simultaneously performed at the same time as scanning in one direction of one side of the substrate G, and thereafter the step of discharging a rinse solution and the step of discharging gas may be concurrently performed at the same time as scanning in the reverse direction to the one direction of the one side of the substrate G, and moreover it goes without saying that the step of discharging gas may be performed with scanning in the one direction of the one side of the substrate G and scanning in the reverse direction to the one direction of the one side of the substrate G being repeated.

Furthermore, needless to say, the step of discharging a developing solution and the step of discharging gas may be simultaneously performed at the same time as scanning in one direction of one side of the substrate G, the step of discharging a rinse solution may be then performed at the same time as scanning in the reverse direction to the one direction of the one side of the substrate G, thereafter the step of discharging gas may be performed at the same time as scanning in the one direction of the one side of the substrate G, and then the step of discharging gas may be performed with scanning in the reverse direction to the one direction of the one side of the substrate G and scanning in the one direction of the one side of the substrate G being repeated.

In addition, it is possible that the step of discharging a developing solution is performed at the same time as scanning in one direction of one side of the substrate G, then the step of discharging a rinse solution is performed at the same time as scanning in the reverse direction to the one direction of the one side of the substrate G, and that thereafter the step of discharging gas is performed with scanning in the one direction of the one side of the substrate G and scanning in the reverse direction to the one direction of the one side of the substrate G being repeated, in which case it is needless to say that in the step of discharging a rinse solution, the step of discharging gas may be performed simultaneously.

Moreover, it is possible that the step of discharging a developing solution is performed at the same time as scanning in one direction of one side of the substrate G, then the step of discharging gas is performed at the same time as scanning in the reverse direction to the one direction of the one side of the substrate G and in the one direction of the one side of the substrate G, thereafter the step of discharging a rinse solution is performed at the same time as scanning in the reverse direction to the one direction of the one side of the substrate G, and that subsequently the step of discharging gas is performed with scanning in the direction of the one side of the substrate G and scanning in the reverse direction to the one direction of the one side of the substrate G being repeated, in which case it is needless to say that in the step of discharging a rinse solution, the step of discharging gas may be performed simultaneously.

As for the combination of steps and scanning directions, naturally combinations which are not described are also possible.

It goes without saying that temperature and humidity controlled N2 gas can be discharged when N2 gas is discharged. A temperature/humidity controller not shown is provided in each of the gas feeders 56 to 59 to control the temperature and humidity of N2 gas to be discharged. With scanning in one direction of one side of the substrate G, temperature and humidity controlled N2 gas is discharged to control the temperature of processing atmosphere, and at the same time the step of discharging a developing solution is performed. Since the temperature of processing atmosphere can be controlled, the dissolving speed of the resist is controllable. Beside, the humidity of processing atmosphere can be controlled by discharging humidity controlled N2 gas, thereby preventing the concentration of the developing solution from changing. After scanning is performed to the edge portion of the substrate G, the step of discharging a rinse solution and the step of discharging N2 gas are performed at the same time as scanning in the reverse direction to the one direction of the one side of the substrate G, whereby edge processing capacity and drying ability are further improved.

Although N2 gas is used as an inert gas in the embodiments, Ar gas, helium gas, and the like are also available. Moreover, it is needless to say that instead of an inert gas, gases which do not react with a resist solution and a developing solution, for example, clean air and the like can be used.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus, comprising:
    a holding member for holding in a substrate;
    a first nozzle having a plurality of discharge ports, each facing an edge portion of the substrate, for discharging a developing solution to the edge portion of the substrate held by said holding member without discharging the developing solution to a central portion of the substrate;
    a second nozzle disposed adjacent to said first nozzle and having a discharge port facing the edge portion of the substrate, for discharging a rinse solution to the edge portion of the substrate held by said holding member without discharging the rinse solution to the central portion of the substrate; and
    a carrier that carries said second nozzle and said first nozzle in the direction of one side of the substrate held by said holding member.

2. The apparatus as set forth in claim 1, further comprising:
    a third nozzle having a plurality of discharge ports wherein each of said discharge ports discharges predetermined gas to the edge portion of the substrate.

3. The apparatus as set forth in claim 2, further comprising:
    a controller that controls the discharge of the predetermined gas from said third nozzle and the discharge of the rinse solution from said second nozzle.

4. The apparatus as set forth in claim 2, further comprising:
    a controller that controls the discharge of the rinse solution from said second nozzle and the discharge of the developing solution is discharged from said first nozzle.

5. The apparatus as set fourth in claim 2, further comprising:
    a controller that controls a first discharge time, a second discharge time and a third discharge time, wherein said first discharge time is the period of time that the developing solution is discharged from the first nozzle, said second discharge time is the period of the time that the rinse solution is discharged from the second nozzle, and the third discharge time is the period of time that the gas is discharged from the third nozzle, and
    wherein one of the first, second and third discharge times is different from the other two discharge times.

6. The apparatus as set forth in claim 1, wherein a developing solution discharge time from said first nozzle and a rinse solution discharge time from said second nozzle are either simultaneous or different.

7. The apparatus as set forth in claim 6,
    wherein when the developing solution discharge time from said first nozzle and the rinse solution discharge time from said second nozzle are different, respective scanning direction is different.

8. A substrate processing apparatus, comprising:
    a substrate holder that holds a substrate;
    an edge processing head having a first nozzle that discharges a developing solution to an edge portion of the substrate held by said substrate holder, and
    a second nozzle arranged adjacent to the first nozzle that discharges a rinse solution to the edge portion of the substrate held by said substrate holder;
    a carrier that carries said edge processing head in a direction of one side of the substrate held by said substrate holder; and
    a controller that controls discharge of a developing a solution from the first nozzle and that controls discharge of a rinse solution from the second nozzle disposed at the rear in a scanning direction when said edge processing head is moved by said carrier.

9. The apparatus as set forth in claim 8,
    wherein two pairs of the second nozzles are disposed adjacent to the first nozzle, with the first nozzle between them, and
    wherein while said edge processing head is carried in a first direction along a first side of the substrate, the discharge of a rinse solution from the second nozzle at the front in the first direction is stopped, a developing solution is discharged from the first nozzle to the rear of the above second nozzle, and a rinse solution is discharged from the second nozzle to the rear of the first nozzle, and contrary to the above, while said edge processing head is carried in the other direction of the one side of the substrate, the discharge of a rinse solution from the second nozzle at the front in the other direction is stopped, a developing solution is discharged from the first nozzle to the rear of the above second nozzle, and a rinse solution is discharged from the second nozzle to the rear of the first nozzle.

10. The apparatus as set forth in claim 9, wherein the first nozzle and the- second nozzle are provided for both the front and rear faces of substrate.

11. The apparatus as set forth in claim 10, wherein the substrate has a rectangular shape, and wherein said edge processing head and said carrier are provided at each side of the substrate.

12. The apparatus as set forth in claim 11, further comprising:

an evacuator that draws the developing solution discharged from the first nozzle and the rinse solution discharged from the second nozzle in the outer peripheral direction of the substrate.

13. The apparatus as set forth in claim 12, further comprising, a gas manifold that delivers an inert gas to the edge portion of the substrate via the second nozzle.

14. The apparatus as set forth in claim 13, wherein the developing solution has a high concentration of approximately 10%, and wherein the rinse solution is demineralized water.

15. A substrate processing method, comprising the steps of:

discharging a developing solution to an edge portion of a held substrate from each of a plurality of discharge ports facing the edge portion of the substrate, without discharging the developing solution to a central portion of the substrate; and discharging a rinse solution to the edge portion of the held substrate from each of a plurality of discharge ports facing the edge portion of the substrate, without discharging the rinse solution to the central portion of the substrate.

16. The method as set forth in claim 15, further comprising the step of:

discharging predetermined gas to the edge portion of the held substrate from each of a plurality of discharge ports.

17. The method as set forth in claim 15, wherein operating times for the step of discharging a developing solution and the step of discharging a rinse solution are at least partially overlapped.

18. The method as set forth in claim 16, wherein at least two steps out of the step of discharging a developing solution, the step of discharging a rinse solution, and the step of discharging the predetermined gas are performed simultaneously.

19. The method as set forth in claim 15, wherein the step of discharging a developing solution is performed at the same time as carrying the discharge ports in one direction of one side of the substrate, and wherein the step of discharging a rinse solution is performed at the same time as carrying the discharge ports in the reverse direction to the one direction of the one side of the substrate.

20. The method as set forth in claim 16, wherein the step of discharging a developing solution and/or the step of discharging the predetermined gas are performed at the same time as carrying the discharge ports in one direction of one side of the substrate, and the step of discharging a rinse solution and/or the step of discharging the predetermined gas are performed at the same time as carrying the discharge ports in the reverse direction to the one direction of the one side of the substrate.

* * * * *